United States Patent [19]

Tateno et al.

[11] 4,090,155
[45] May 16, 1978

[54] TRANSMISSION LINE FOR ELECTROMAGNETIC WAVE

[75] Inventors: Hiroshi Tateno; Shoei Kataoka, both of Tanashi; Nobuo Hashizume, Kawasaki; Yasuo Komamiya, Yokohama, all of Japan

[73] Assignee: Agency of Industrial Science & Technology, Tokyo, Japan

[21] Appl. No.: 668,986

[22] Filed: Mar. 22, 1976

[30] Foreign Application Priority Data

| | | |
|---|---|---|
| May 12, 1975 | Japan | 50-54755 |
| May 16, 1975 | Japan | 50-57249 |
| May 21, 1975 | Japan | 50-59650 |
| Jun. 5, 1975 | Japan | 50-67010 |

[51] Int. Cl.² .......... H01P 1/22; H01P 1/15; H01P 3/08; H03F 3/54
[52] U.S. Cl. .......... 333/80 T; 330/5; 330/61 A; 333/81 B; 333/97 R; 333/98 R
[58] Field of Search .......... 333/31 R, 97, 95 R, 333/98 R, 84 M, 84 R, 95 S, 81 A, 81 B, 80 R, 80 T, 7 D, 7 R; 332/52, 53, 31 T; 357/15; 330/5, 61 R, 61 A

[56] References Cited

U.S. PATENT DOCUMENTS

| | | | |
|---|---|---|---|
| 3,432,778 | 3/1969 | Ertel | 333/81 A X |
| 3,827,002 | 7/1974 | Chao | 357/15 X |
| 3,971,057 | 7/1976 | Connors et al. | 357/15 X |

FOREIGN PATENT DOCUMENTS

2,233,468  1/1974  Germany .................. 333/84 M

*Primary Examiner*—Alfred E. Smith
*Assistant Examiner*—Marvin Nussbaum
*Attorney, Agent, or Firm*—Oblon, Fisher, Spivak, McClelland & Maier

[57] ABSTRACT

A transmission line is disclosed which comprises a conductive layer, a resistive semiconductor layer disposed on the conductive layer and a blocking electrode disposed on the resistive semiconductor layer. By applying a biasing voltage between the blocking electrode and the conductive layer, a depletion layer is produced in the resistive semiconductor layer, the depletion layer formed in the semiconductor layer being used as a medium for transmission of electromagnetic wave.

16 Claims, 62 Drawing Figures

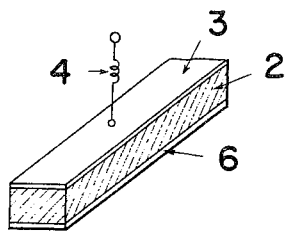
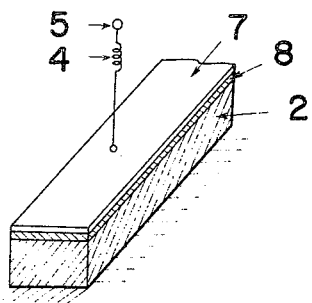
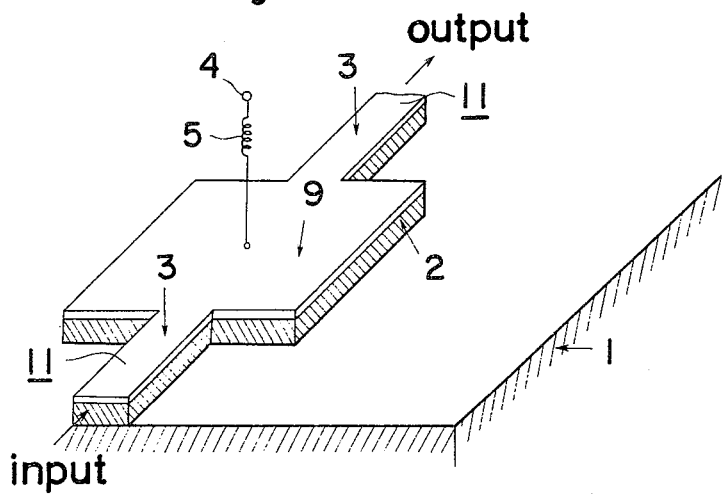
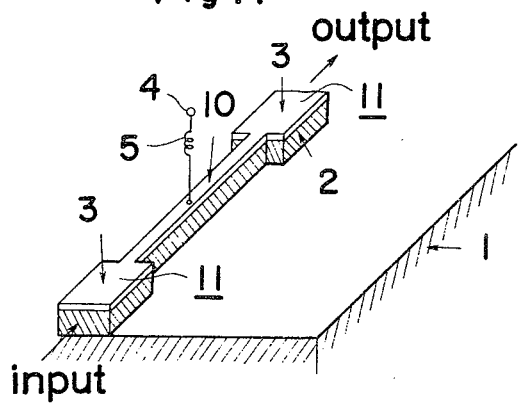

Fig.10
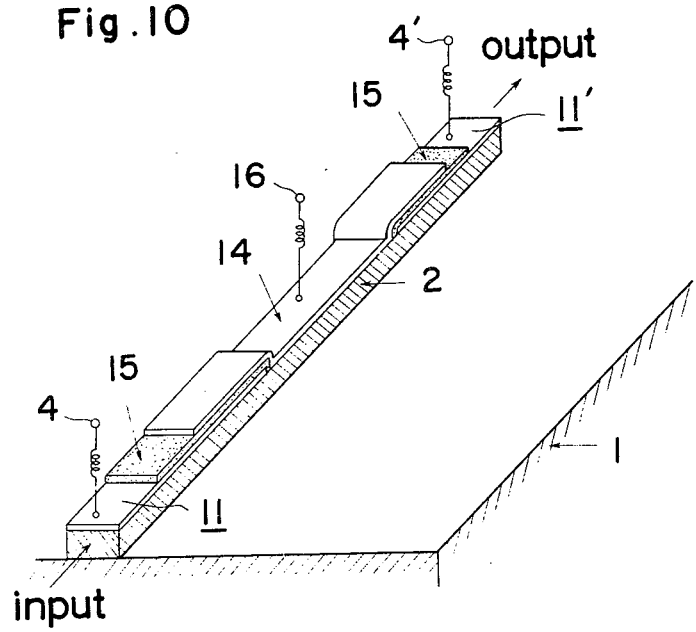
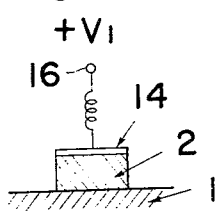
Fig.11A
+V₁
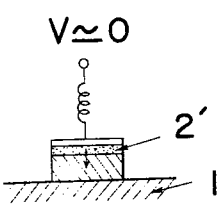
Fig.11B
V≃0
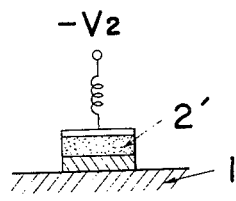
Fig.11C
−V₂
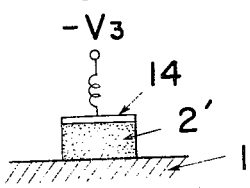
Fig.11D
−V₃

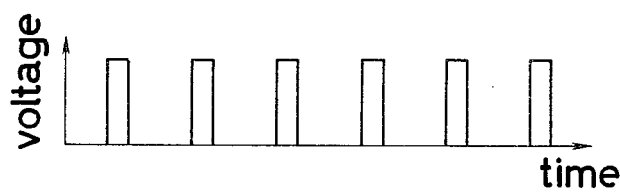
Fig.19A
Fig.19B
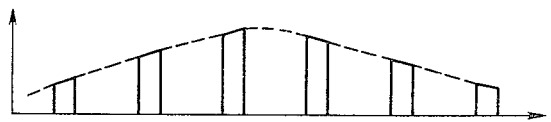
Fig.19C
Fig.20
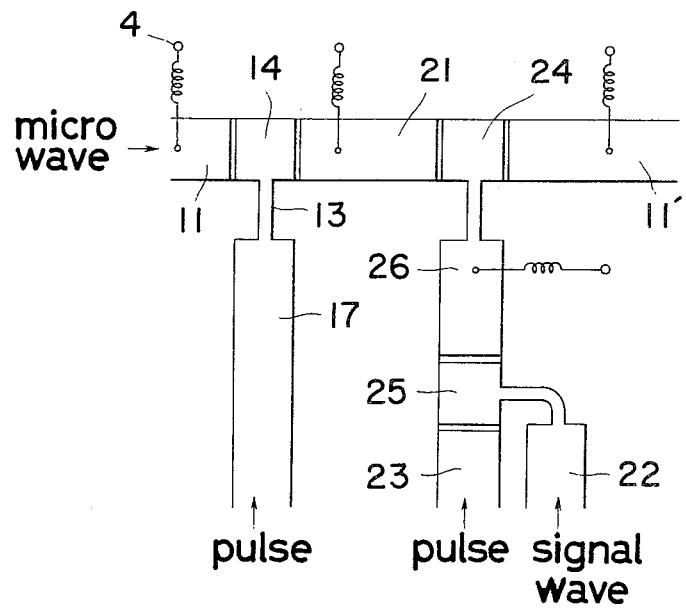

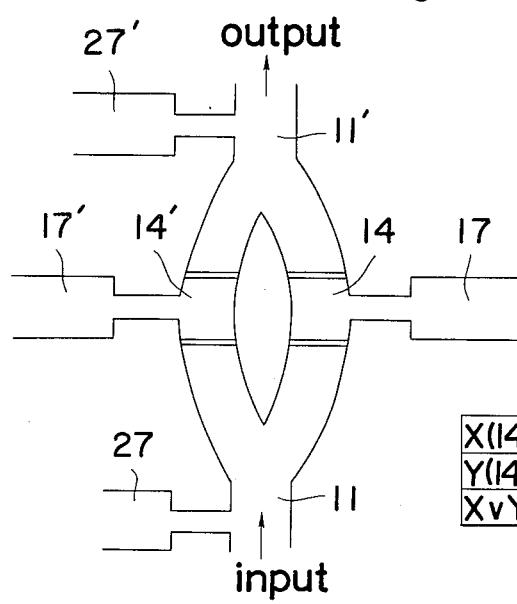
Fig. 28(A)
Fig. 28(B)
| X(14) | 0 | 0 | 1 | 1 |
|---|---|---|---|---|
| Y(14') | 0 | 1 | 0 | 1 |
| XvY | 0 | 1 | 1 | 1 |
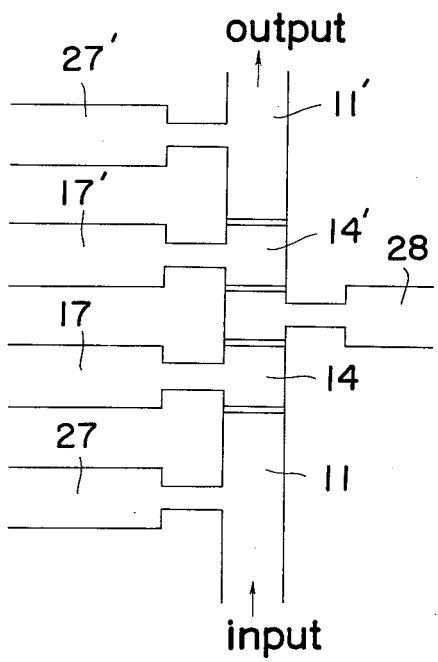
Fig. 29(A)
Fig. 29(B)
| X(14) | 0 | 0 | 1 | 1 |
|---|---|---|---|---|
| Y(14') | 0 | 1 | 0 | 1 |
| X·Y | 0 | 0 | 0 | 1 |

Fig.30
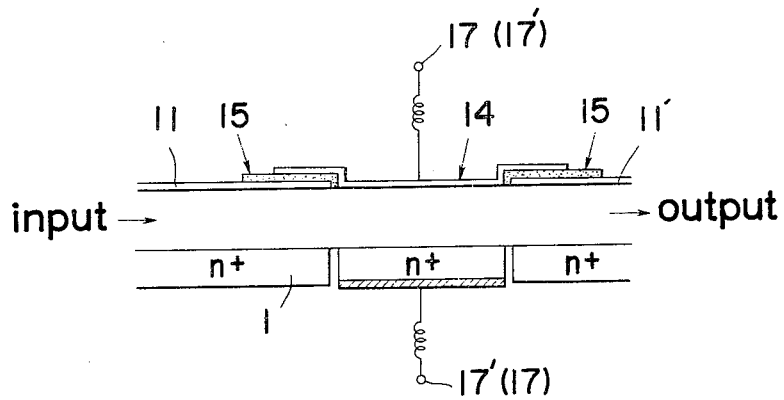
Fig.31(A)
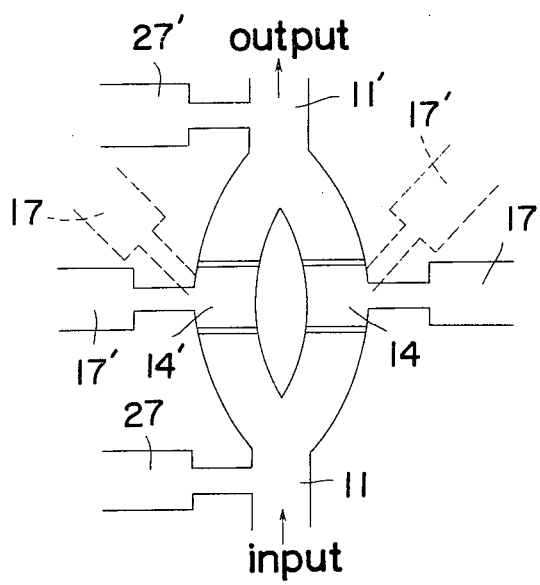
Fig.31(B)
| X(16) | 0 | 0 | 1 | 1 |
|---|---|---|---|---|
| Y(16') | 0 | 1 | 0 | 1 |
| X⊕Y | 0 | 1 | 1 | 0 |

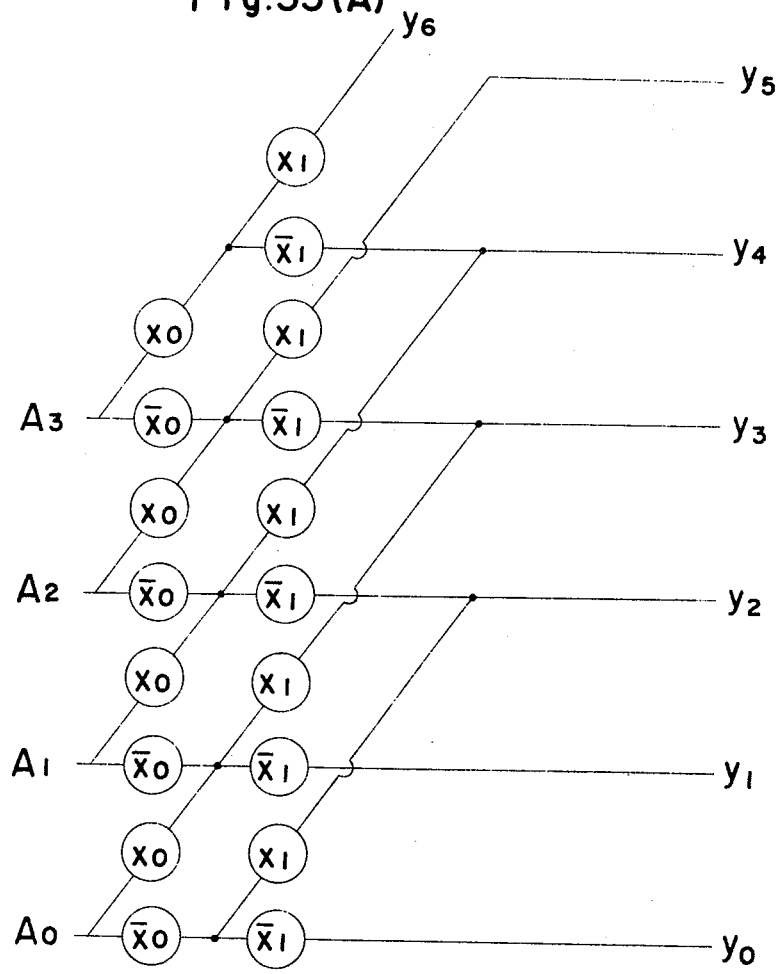

TRANSMISSION LINE FOR ELECTROMAGNETIC WAVE

BACKGROUND OF THE INVENTION

The present invention relates to an electromagnetic wave transmission line for use in an integrated circuit (IC) or the like and, in particular, relates to a transmission line which exhibits superior transmission characteristics, particularly, in transmitting microwave or millimeterwave, and to a transmission line provided with integral circuit elements formed by partially deforming the line itself.

The conventional transmission line for microwave transmission has utilized a coaxial line, a rectangular waveguide or a circular waveguide. Further, there has recently been developed an integrated device utilizing active and passive microwave elements. In such derive the respective elements are connected to a micro-strip line or a transmission line having sandwitch construction composed of an n-type semiconductor layer with high doping concentration, an ohmic electrode and an n-type semiconductor layer with very low doping concentration sandwitched therebetween.

All conventionally proposed transmission lines are, however, passive and, therefore, once the parameters of the line are determined, it is difficult to change them by externally applied signals. Furthermore, conventional transmission lines have the disadvantage that line loss increases with increasing frequencies.

One object of the present invention is to overcome the disadvantages inherent in the conventional transmission line by providing a novel transmission line for electromagnetic wave which is lossless or even has amplification characteristics at any given frequency.

Another object of the present invention is to provide a transmission line which by partial deformation of the transmission line itself is provided with such integral circuit elements as a capacitance element, an inductance element, a resistive element or a switching element, amplifying element, oscillation element, amplitude modulation element, etc., singularly or in combination.

SUMMARY OF THE INVENTION

In order to achieve the above objects of the present invention, there is provided a transmission line for electromagnetic wave comprising a conductive layer, a resistive semiconductor layer formed on said conductive layer, said resistive semiconductor layer having properties excluding Gunn effect oscillation, at least one blocking electrode formed on said resistive semiconductor layer, and means for applying a bias voltage suitable to produce a depletion layer in said resistive semiconductor layer to said blocking electrode, said depletion layer being used as a medium for transmitting electromagnetic wave. Further in the transmission line circuit elements such as capacitance element, inductance element, resistive element, switching element, amplifying element, oscillation element, amplitude modulation element, etc. can be formed by partially deforming the structural configuration of the transmission line. The above-mentioned transmission line can be easily realized by using a semiconductor forming the conductive and resistive layers fabricated by conventional epitaxial growth techniques and etching the layers according to the conventional etching techniques, and functions to transmit the electromagnetic waves of ultra high frequency without suffering any loss, or even with amplification characteristics.

Other objects and characteristic features of the present invention will be hereinafter described in detail with reference to the accompanying drawings.

BRIEF EXPLANATION OF THE DRAWINGS

FIGS. 4 and 5 are perspective views of further embodiments of the transmission line according to the present invention, respectively;

FIG. 6 is a perspective view of an embodiment of the transmission line according to the present invention which has a capacitance element property;

FIG. 7 is a perspective view of another embodiment of the transmission line according to the present invention which has an inductance element property;

FIG. 10 is a perspective view of another embodiment of the transmission line according to the present invention which has a variable attenuation element property;

FIGS. 11A through 11D are explanatory illustrations showing the operation of the transmission line in FIG. 10;

FIGS. 19A through 19C are explanatory illustrations of the process by which the pulse amplitude modulation is performed;

FIG. 20 is an explanatory illustration of another embodiment of the transmission line having a microwave modulation element property by which the pulse amplitude modulated wave is further modulated with microwave;

FIG. 28(A) is an explanatory illustration of another embodiment constituting a logical sum circuit element by using the switching element in FIG. 27;

FIG. 28(B) shows a truth table of the element in FIG. 28(A);

FIG. 29(A) is an explanatory illustration of another embodiment constituting a logical product circuit element by using the switching element in FIG. 27;

FIG. 29(B) is a truth table of the element in FIG. 29(A);

FIG. 30 is an explanatory illustration of another embodiment constituting a negation circuit element by using the switching element in FIG. 27;

FIG. 31(A) is an explanatory illustration of another embodiment constituting an exclusive logical sum circuit element by using the switching element in FIG. 27;

FIG. 31(B) is a truth table of the element in FIG. 31(A);

FIG. 33(A) is an explanatory illustration of another embodiment constituting a shift line circuit element by using the switching element in FIG. 27; and FIG. 33(B) is a truth table of the element in FIG. 33(A).

DETAILED DESCRIPTION OF PREFERRED EMBODIMENTS

Figure 1:
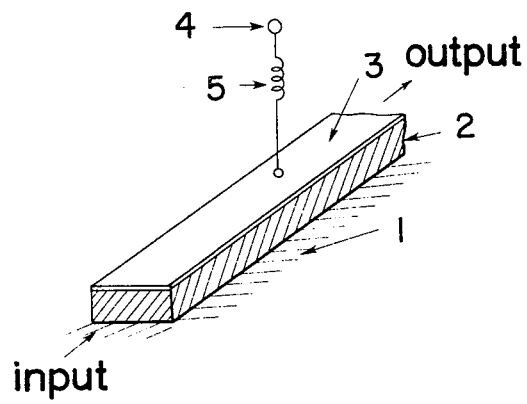
FIG. 1 is a perspective view of an embodiment of the transmission line according to the present invention.

FIG. 1 shows a perspective view and FIG. 2 a cross-sectional view of an embodiment of the present transmission line for electromagnetic wave. In these Figures, a conductive layer 1 which is, for example, an $n^+$-type semiconductor layer having high impurity density is provided thereon with a resistive semiconductor layer 2 which is, for example, an n-type semiconductor layer having carrier density on the order of $10^{13}$ to $10^{15} cm^{-3}$ in low electric field. On the resistive semiconductor layer 2, a Schottky electrode (blocking electrode) 3 is provided. The Schottky electrode 3 is connected to a bias terminal 4 through an inductor 5 for blocking high frequency component such as microwave. The lengths of the Schottky electrode 3 and the underlying n-type semiconductor layer 2 is made sufficiently long for the line to satisfy its function as a transmission line.

Figures 2A, 2B:
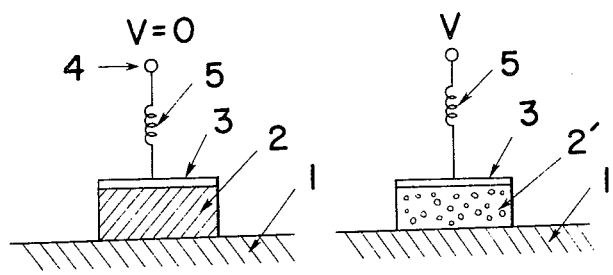
FIGS. 2A and 2B are explanatory illustrations showing the operation of the transmission line in FIG. 1.

The principle of the present transmission line will be described in reference to the cross-sectional view in FIG. 2. By applying a reverse bias voltage to the bias terminal 4, a depletion layer is produced in the n-type semiconductor layer 2 due to the Schottky effect, and if the thickness of the n-type semiconductor layer 2 is thin, the entire n-type semiconductor layer 2 is covered with the depletion layer 2' because the depletion layer cannot be penetrated into the $n^+$-type semiconductor and, therefore, the depletion layer 2' can be situated in the n-type semiconductor layer 2 as shown in FIG. 2(B).

When intimate contact between an n-type semiconductor layer 2 such as GaAs or InP having a relatively large energy gap between the valence band and the conduction band and a metal layers which makes a high potential barrier in the n-type semiconductor are made, the depletion layer 2' can be considered as a dielectric when a voltage is applied. This means that a strip line is constituted between the $n^+$-type semiconductor layer 1 and the Schottky electrode 3. Therefore, when an electromagnetic wave is supplied to the n-type semiconductor layer 2 under this condition as shown in FIG. 1, the electromagnetic wave can propagate along this line. The purpose of the inductor 5 is to prevent the electromagnetic wave from leaking toward a D.C. power source.

Figure 3:
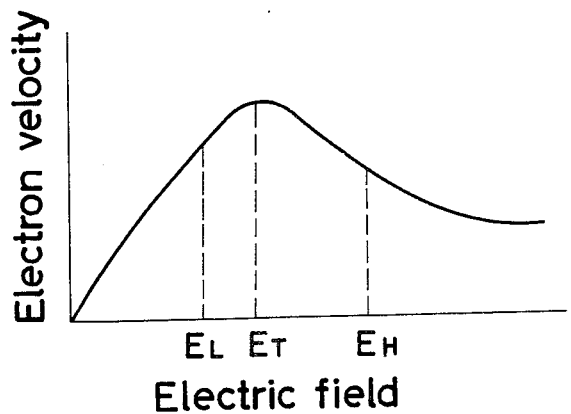
FIG. 3 is a graph showing an electron velocity vs. electric field intensity characteristics of a semiconductor.

A semiconductor such as GaAs or InP has electron velocity-electric field characteristics as shown in FIG. 3. If a semiconductor having a negative differential mobility such as depicted in FIG. 3 is used as the n-type semiconductor layer 2 and a metal having a relaively low barrier which is made, for instance, by heat treating the metal electrode made of Au-Sn or Au-Ge alloy at an appropriate temperature is used for the Schottky electrode 3, then when there is applied a voltage large enough to produce a depletion layer 2' which reaches up to the $n^+$-type semiconductor layer 1 and to maintain the electric field in the depletion layer 2' substantially uniform, the conduction loss of the semiconductor at high frequency is substantially weakened. When the bias voltage is further increased, a negative resistance effect due to the negative differential mobility appears. Since the D.C. current and the microwave current are in a common plane with the D.C. current and in the direction parallel to or anti-parallel to the D.C. current, the two currents are strongly coupled, so that losses in other portions such as metal and $n^+$-semiconductor are somewhat compensated for. By utilizing a Schottky electrode forming the lower barrier, the loss in the Schottky electrode at high frequency and the loss in the $n^+$-type semiconductor layer portion at high frequency are completely compensated for. In this manner, according to the present invention, a lossless transmission line obtained for the first time. Further, by lowering the barrier height, the effect of the negative differential resistance is enhanced so that it becomes possible to realize a transmission line having amplification characteristics. In this case, the amplification per unit length of the transmission line is a function of the electric field and, therefore, a variable amplifier is realizable by varying the bias voltage.

On the other hand, the nature of the Schottky electrode approaches that of an ohmic electrode with increase in the barrier height. In this case, where a product of the electron density "$n$" in the depletion layer and the width of the depletion layer "$l$" (the distance between the Schottky electrode and the n+-type semiconductor layer) is larger than a certain value "$A$", that is, where $$n \cdot l \gtrsim A$$

a high electric field domain will travel periodically between the Schottky electrode and the n+-type semiconductor layer due to the Gunn effect. When n-type GaAs is used for the present invention, it is needed to have the distance of the Schottky electrode and n+-type GaAs layer being 3 to 30 μm in order to fill the n-type GaAs layer with the depletion layer, so that the product "$n \cdot l$" becomes much less than $10^{12} cm^{-3}$, which makes irrevant to Gunn oscillations. Therefore, effect of negative resistance can be effectively utilized.

FIGS. 4 and 5 show other embodiment of the transmission line according to the present invention. In FIG. 4, an ohmic electrode 6 is used instead of the n+-type semiconductor layer 1 in the embodiment in FIGS. 1 and 2. On the other hand, in FIG. 5, a p-type semiconductor layer 8 is formed between the ohmic electrode 7 and the n-type semiconductor layer 2 to form a depletion layer on the basis of the P-N junction therebetween. It should be noted that any type of blocking electrode can be employed to form the depletion layer. The formation of the depletion layer may be obtained by using an n-type semiconductor instead of the p-type semiconductor. In such case, however, it is necessary to inverse the polarity of the biasing voltage.

Other embodiments will now be described in which circuit elements are formed in the transmission line by partially deforming the structural configuration of the transmission line.

FIG. 6 shows an embodiment in which an intermediate portion of the transmission line shown in FIG. 1 is widened to form a capacitance element in the line and FIG. 7 shows another embodiment in which an intermediate portion of the transmission line shown in FIG. 1 is narrowed to form an inductance element in the line.

In FIG. 6, by applying to terminal 4 a reverse biasing voltage large enough to fill the n-type semiconductor layer 2 with a depletion layer due to the effects of the blocking electrodes 3 and 9, the resulting depletion layer is made to function as a dielectric for electromagnetic wave. Therefore, the blocking electrodes 3, the depletion layer and the n+-type semiconductor layer 1 form a transmission line 11. Since the width of the portion of the line below the blocking electrode 9 is wider than that of the portions below the blocking electrodes 3, a capacitance element is formed in the line.

On the other hand, in FIG. 7, by applying to terminal 4 a reverse biasing voltage large enough to fill the n-type semiconductor layer 2 with a depletion layer due to the effects of the blocking electrodes 3 and 10, a transmission line is formed below the electrodes 3 and 10 as in the embodiment in FIG. 6. Since the width of the portion below the blocking electrode 10 is narrower than that of the portions below the blocking electrodes 3, this portion forms an inductance element. In the devices shown in FIGS. 6 and 7, since there are almost no electrons in the n-type semiconductor layer 2 due to the effect of the blocking electrode, the layer forms an equivalent dielectric which has excellent microwave transmission characteristics and, therefore, a capacitance element or, an inductance element having superior characteristics can be obtained. Furthermore, if a semiconductor such as GaAs or InP which exhibits negative differential mobility a high electric field is used, and the blocking electrode is made from a metal contact having a relatively low barrier, then when a voltage above the threshold above which the depletion layer exhibits negative differential mobility is applied to the blocking electrode, the circuit element formed in the transmission line comes to have negative differential resistance which compensates for the positive resistances in the blocking electrodes and the n+-type semiconductor. Accordingly, if the reverse biasing voltage is fixed at a certain value above the threshold voltage so that the negative differential resistance compensates for the whole positive resistance, the capacitance or the inductance provided in the transmission line becomes lossless.

Figure 8:
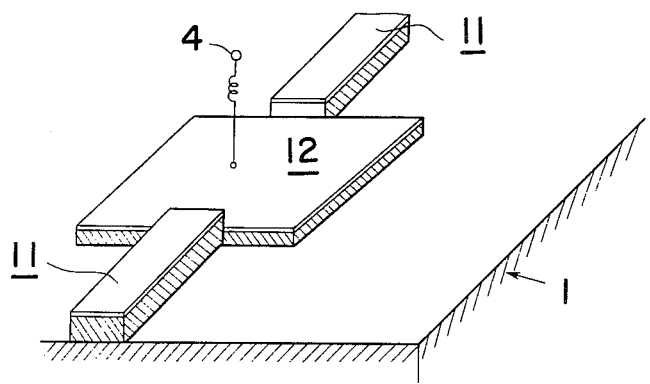
FIG. 8 is a perspective view of another embodiment of the transmission line according to the present invention which has a capacitance element property.
Figure 9:
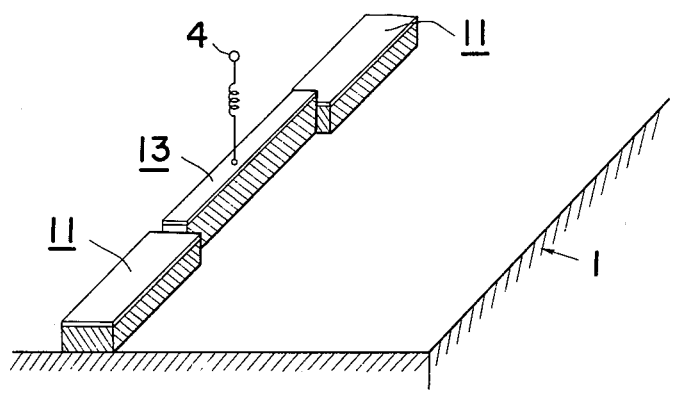
FIG. 9 is a perspective view of another embodiment of the transmission line according to the present invention which has an inductance element property.

FIGS. 8 and 9 show further embodiments, in each of which the effect of capacitance or the inductance is enhanced by making the thickness of the transmission line portion different from that of the element portion. FIG. 8 shows a transmission line comprising a capacitance portion 12 and transmission portions 11 the height of which is larger than that of the capacitance portion 12. With this structure, the capacitance per unit area of the capacitance portion 12 becomes larger than that obtainable with an even height structure and, therefore, a given amount of capacitance can be obtained with even a smaller area. On the other hand, when the height of the inductance portion 13 is made larger than that of the transmission line portions 11 as shown in FIG. 9, the inductance per unit length of the inductance portion 13 becomes large and, therefore, the desired inductance can be obtained with smaller length than in the embodiment in FIG. 6.

FIG. 10 shows a perspective view and FIG. 11 a cross-sectional view of another embodiment having a variable attenuation property. In this embodiment, it is necessary to apply a voltage to a blocking electrode 14 in the attenuation portion separately from the transmission portions 11, 11'. For this reason, the transmission portions 11, 11' are separated by insulators 15 from the electrode 14 of the element portion. In other words, the transmission portions 11, 11' are coupled capacitively to the electrode 14. When a forward voltage above the voltage corresponding to the barrier height is applied to the terminal 16, the depletion layer in the n-type semiconductor layer 2 disappears completely as shown in FIG. 11(A) and, therefore, electromagnetic wave cannot pass through this portion. However, if the voltage applied to the terminal 16 is started from zero in reverse direction, the depletion layer 2' produced in the portion of the n-type semiconductor layer 2 below the blocking electrode 14, spread over the other portions of the layer 2 with increasing the reverse voltage as shown with the arrow in FIG. 11(B). Therefore, the power of the electromagnetic wave passing through the element portion increases with the increase in reverse biasing voltage.

When the reverse biasing voltage applied to the terminal 17 is increased to cause the depletion layer 2' to expand from the state in FIG. 11(C) to that in FIG. 11(D) in which the depletion layer 2' enters into the n+-type semiconductor layer 1, the input electromagnetic wave power can pass through the element portion without experiencing any obstacles and appears at the output without loss. This operation is that of a variable attenuator and, therefore, the structure in FIG. 10 can provide an attenuation property. Even if a semiconductor exhibiting negative differential mobility is used as the n-type semiconductor layer in the structure in FIG. 11, it can also act as an attenuator provided that the differential mobility is positive in the state in FIG. 11(D). However, application of a voltage which causes the electric field intensity in the depletion layer 2' to exceed the threshold value causes the electromagnetic wave to be amplified during its passage through the n-type semiconductor layer. Accordingly, the transmission line in this case acts as an amplifier.

Figure 12:
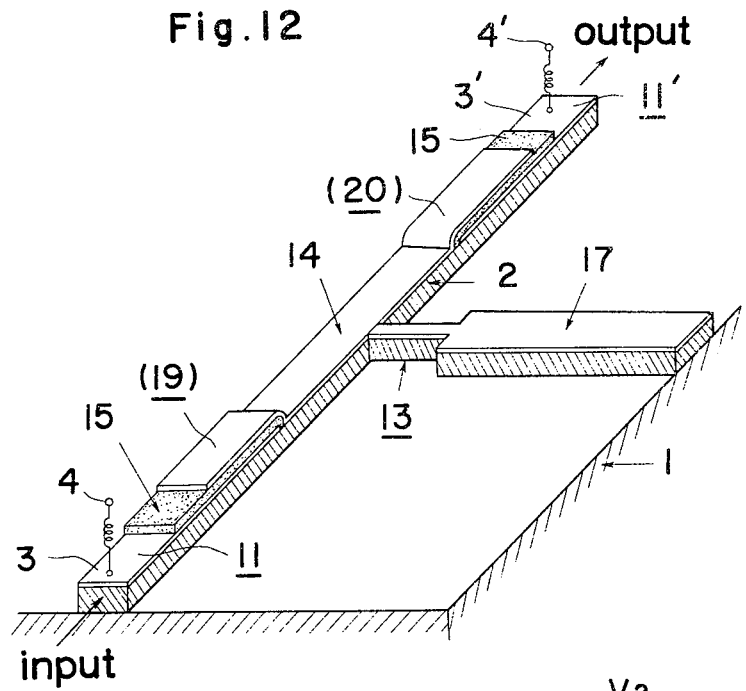
FIG. 12 is a perspective view of another embodiment of the transmission line according to the present invention which has a variable attenuation element property.

The line shown in FIG. 12 has the same function as that in FIG. 10. The difference therebetween is in the biasing system. In FIG. 12, the bias voltage is applied between the n$^+$-type semiconductor layer 1 and the blocking electrode 17. In FIG. 12, an inductance portion 13 is connected to the transmission portion and electromagnetic wave passing through the latter is prevented from leaking to the bias voltage source. This bias system can be applied to all of other embodiments of the present invention.

Figure 13:
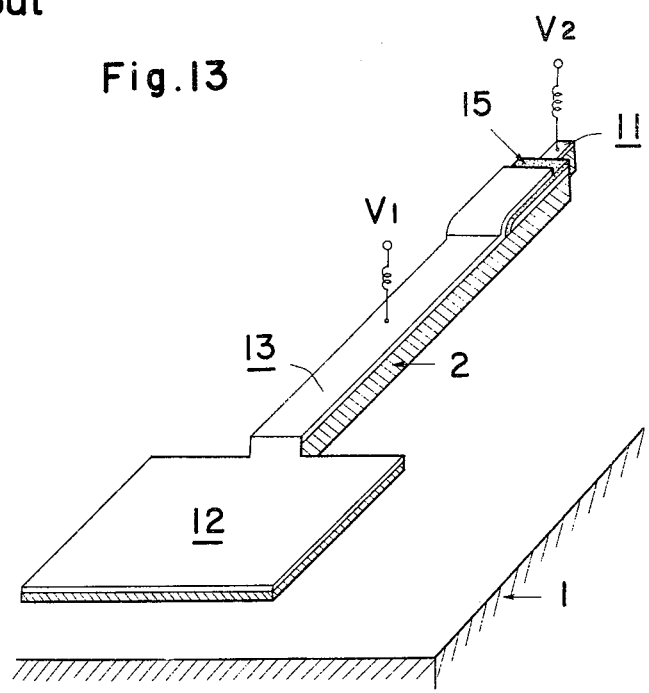
FIG. 13 is a perspective view of another embodiment of the transmission line according to the present invention which has a resonance element or oscillation element property.

FIG. 13 shows an embodiment which exhibits a resonance property or oscillation property. In this case, portion 12 is the capacitance portion and portion 13 is the inductance portion of the transmission line.

When the bias field applied to the n-type semiconductor layer 2 is made smaller than the threshold, the capacitance portion 12 and the inductance portion 13 from a resonator and when the bias field is made larger than the threshold value, the portions form an oscillating element. The fundamental operation frequency of the element may be substantially determined by selecting the length of the inductance portion 13 as one-fourth wave length. In this case, although the coupling of the transmission portion 11 to the portions 12 and 13 is capacitive, induction coupling may also be employed. It is also possible to open the end terminal of the element instead of making it capacitive and to select the length of the transmission line 14 as a half wave length for the fundamental operation frequency.

Figure 14:
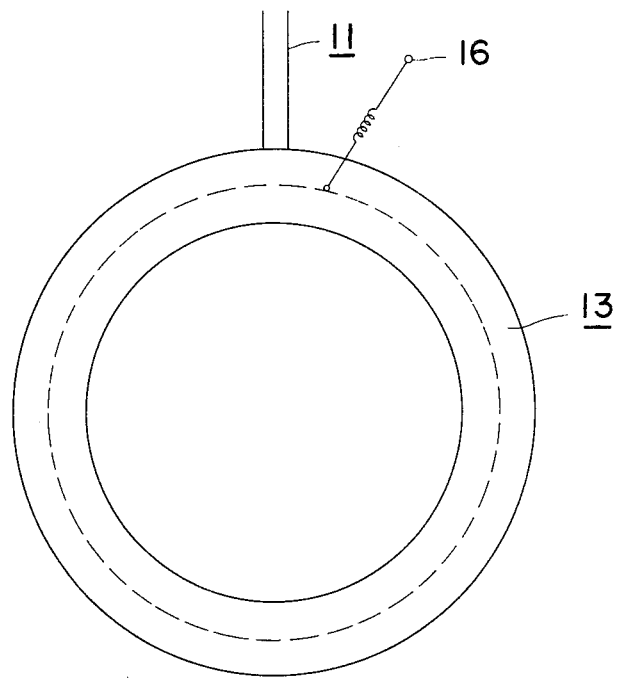
FIG. 14 is a plane view of another embodiment of the transmission line according to the present invention which has a resonance element or oscillation element property.

FIG. 14 is a plane view of an element which can act as a circular resonator or oscillator. This embodiment can excite an electromagnetic wave having a fundamental operation frequency corresponding to the wavelength corresponding to twice the mean length shown by the dotted line of the element.

Figure 15:
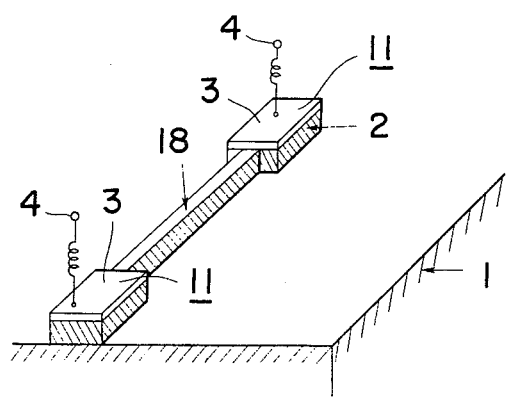
FIG. 15 is a perspective view of another embodiment of the transmission line according to the present invention which has a resistor element property.

FIG. 15 shows another embodiment which has a resistive property. When a resistor is needed in the transmission line 11, it is sufficient to make the blocking electrode 18 thin over a desired length thereof. In order to provide a larger resistivity to the element, a thinner metal having higher resistivity than that of the blocking electrodes 3 provided on the transmission line portions 11 is used as the blocking electrode 18. Therefore, the element in FIG. 15 provides a series resistance. When a capacitance element as shown in FIG. 6 or 8 is connected on one end of the line, this embodiment provides a series resistance at high frequency. On the other hand, if it is necessary to short-circuit in d.c. manner, it is sufficient to bias in positive direction one of the d.c. biasing terminals 10 to eliminate the depletion layer below the selected terminal 10.

In the explanation hereinbefore, the transmission line has been described as having one input terminal and one output terminal aside from the bias portion thereof. It should be noted, however, that a transmission line having multiple inputs and multiple outputs can be easily realized if necessary. For example, if the transmission portion 17 in FIG. 12 is used as an input terminal, a transmission line having two inputs and one output is easily obtained. Further, although the present invention has been described as having n$^+$-type semiconductor as the conductive layer, it may be replaced by an ohmic electrode. In addition, the type of the semiconductor forming the transmission line may be "n" or "p" type semiconductor and when p-type semiconductor is used, the polarity of the bias voltage should be reversed. The portion of the conductive layer (n$^+$-type semiconductor) other than that below the blocking electrode may be removed.

Figure 16:
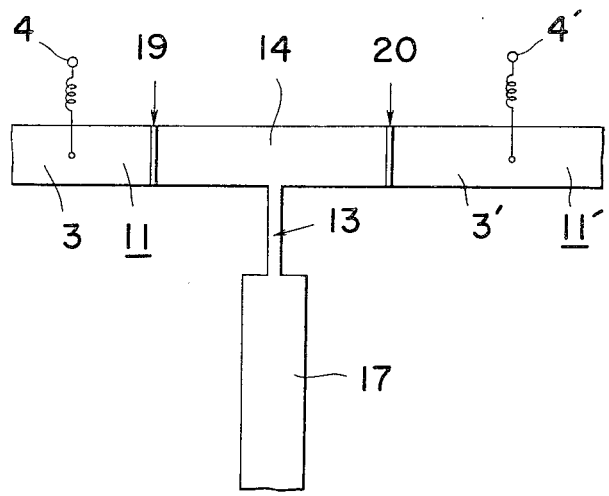
FIG. 16 is an explanatory illustration of an embodiment of the transmission line according to the present invention which has an amplitude modulation element property.
Figure 17A:
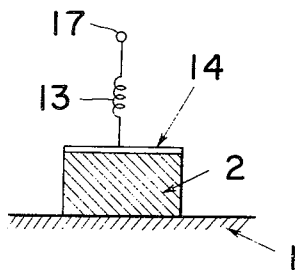
FIGS. 17A through 17D are explanatory illustrations showing the operation of the transmission line in FIG. 16.
Figure 17B:
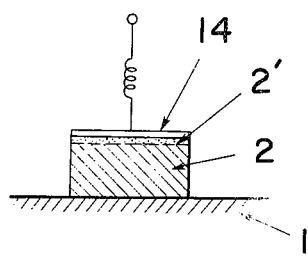
Figure 17C:
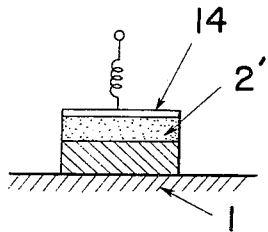
Figure 17D:
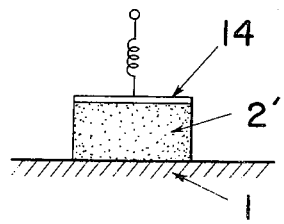

Next there will be described another embodiment in which a transmission line in accordance with this invention is provided with an element of the structure shown in FIG. 12 for the purpose of accomplishing amplitude-modulation of microwave. FIG. 16 shows the elements of FIG. 12 in more simplified form, and capacitors 19 and 20 are each represented by a pair of parallel line.

In FIG. 16, when bias voltages of opposite polarities are applied to the bias terminals 4 and 4' provided for the electrodes 3 and 3', respectively, as to produce depletion layers in the portions of the n-type semiconductor 2, these layers act as dielectric for microwave etc. Therefore, a transmission line is formed between the electrode 3 or 3' and the n$^+$-type semiconductor layer 1. Since the width of the portion 13 which constitutes a signal input transmission line 17 is narrower than other portions, it acts as an inductance preventing the microwave passed through the portion of the electrode 3 from leaking to the signal input transmission line. Further, bypass capacitances 19 and 20 are provided to permit microwave to pass but prevent the signal wave from passing therethrough.

FIG. 17 is a cross section of the modulation portion 14 from which the operation of the present invention will be understood more easily. In FIG. 17, when a forward voltage the value of which is larger than the potential corresponding to the barrier height due to the blocking contact on the n-type semiconductor layer 2 is applied to the terminal 17, the depletion layer substantially disappears (FIG. 17(A)) in the n-type semiconductor layer 2 and, therefore, microwave cannot pass therethrough. With no voltage applied to the terminal 17, a depletion layer 2' the width of which corresponds to the barrier height is produced as shown in FIG. 17(B) and the depletion layer 2' spread out in proportion to the root of the reverse voltage applied to the terminal 17 toward the n$^+$-type semiconductor layer passing through the state shown in FIG. 17(C). At a voltage higher than a certain value, the n-type semiconductor layer 2 is completely filled with the depletion layer 2' as shown in FIG. 17(D).

Thus, in the case of the element in FIG. 12, the control of the reverse voltage corresponds to the control of the path of the microwave. That is, the larger the reverse voltage is the larger the microwave power appearing at the output transmission line, the microwave power at the output terminal continuously increasing until the n-type semiconductor layer is filled completely with the depletion layer in the course of increasing the reverse voltage.

Figure 18A:
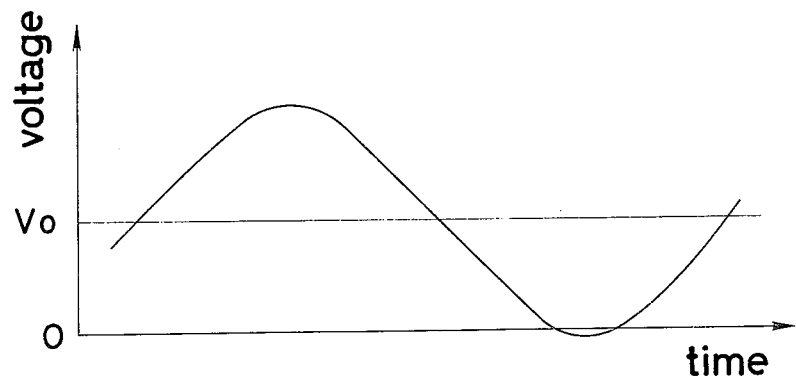
FIGS. 18A through 18C are explanatory illustrations of the process by which the amplitude modulation of microwave is performed.
Figure 18B:
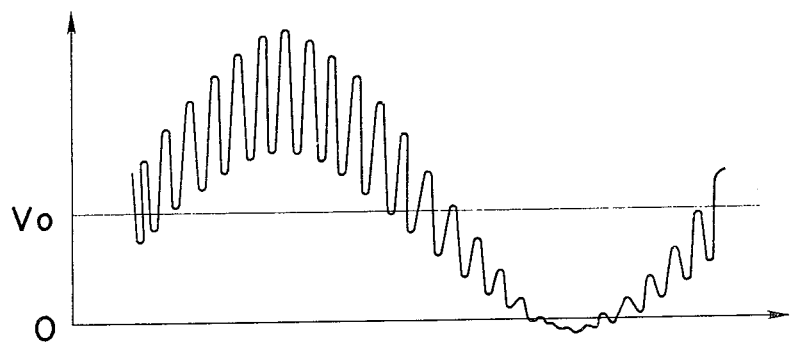

When a signal voltage having a waveform shown in FIG. 18(A) is supplied to the signal input transmission line 17 and microwave power is supplied to the carrier input transmission line, the voltage waveform in the modulation portion becomes that shown in FIG. 18(B). Since the capacitors 19 and 20 block the low frequency component, a modulation output as shown in FIG.

Figure 18C:
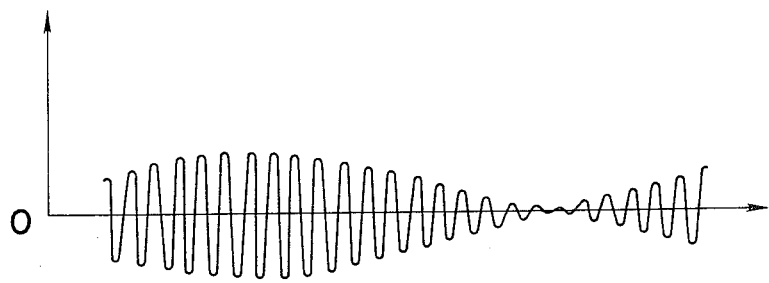

18(C) is obtained in the output transmission line 11'. In FIG. 18, "$V_o$" represents the d.c. bias voltage.

The element shown in FIG. 12 (FIG. 16) may be used as a pulse modulator. When a pulse signal voltage as shown in FIG. 19(A) is applied to the carrier input transmission line 11 of this element and a signal shown in FIG. 19(B) is applied to the signal input transmission line 17, a pulse amplitude modulated wave as shown in FIG. 19(C) is obtained in the output transmission line 11' according to the previously mentioned principle. The amplitude of the pulse signal voltage is, however, needed to be large enough so as to satisfy the condition that the n-type semiconductor is perfectly filled with the depletion layer. In this FIGURE, numeral 14 shows the amplitude modulation portion.

Figure 21A:
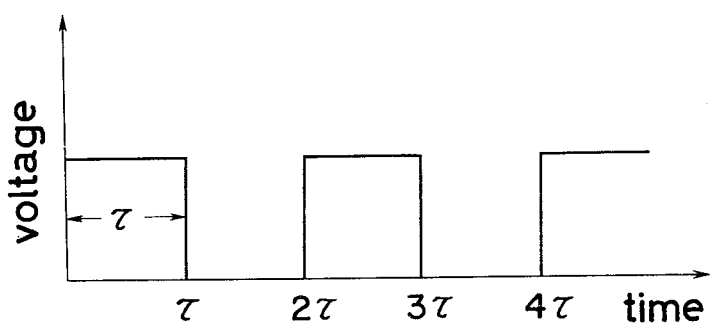
FIGS. 21A through 21C are explanatory illustrations of the process by which the pulse amplitude modulated wave is further modulated by microwave.
Figure 21B:
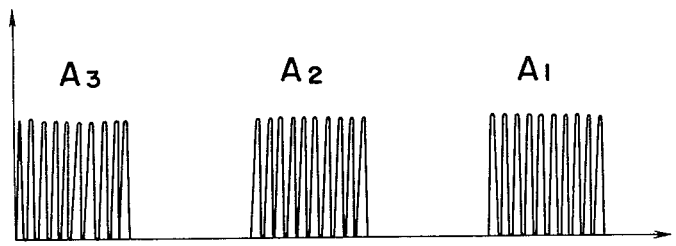

FIG. 20 shows an embodiment by which a pulse amplitude modulation wave is modulated by a microwave. The microwave is supplied to the carrier input transmission line 11. The microwave can pass through the transmission line 14 only when a pulse voltage such as shown in FIG. 21(A) is applied through the signal input transmission line 17 to the line 14. Therefore, a waveform as shown in FIG. 21(B) is obtained in the transmission line 21.

Figure 21C:
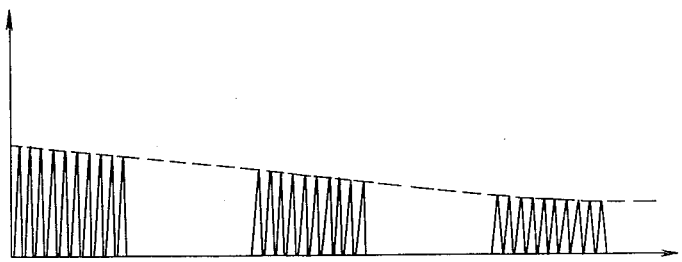

This embodiment is designed such that when there is a signal wave in the transmission line 22, the pulse applied to the transmission line 23 is synchronized with the transmission line 17 and a microwave now having rectangular waveform as a result of the modulation during the passage through the transmission line 14 reaches the transmission line 24. This pulse amplitude modulated wave is modulated again by the microwave in the transmission line 24 so that an output waveform as shown in FIG. 21(C) is obtained in the transmission line 11 according to the variation of the signal wave.

Figure 22:
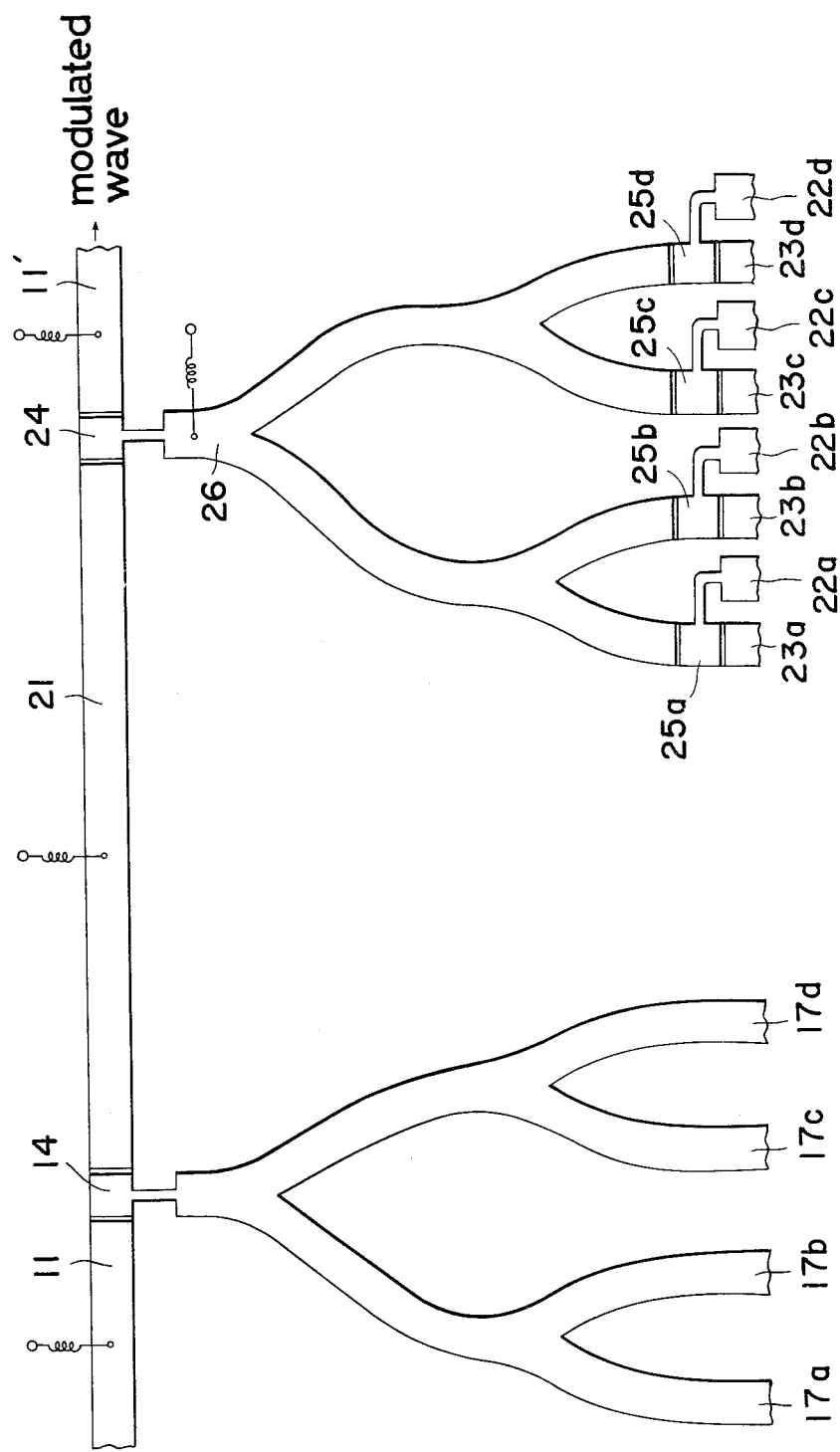
FIG. 22 is an explanatory illustration of another embodiment of the transmission line according to the present invention which modulates the pulse amplitude modulated waves in four channels with microwave.
Figure 23A:
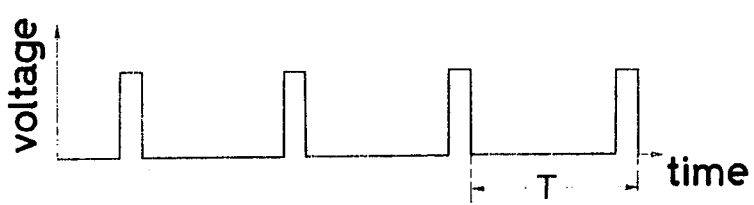
FIGS. 23A through 23D are explanatory illustrations of pulse waveforms for pulse-modulating the respective signals in FIG. 9.
Figure 23B:
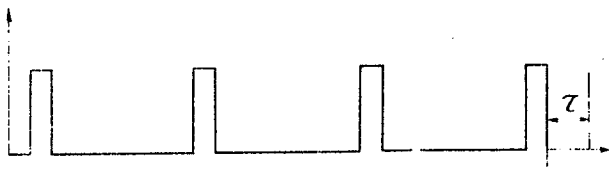
Figure 23C:
Figure 23D:
Figure 24A:
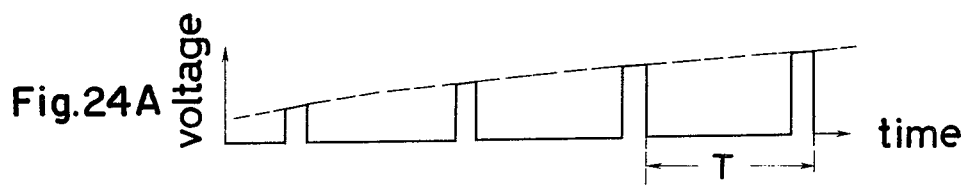
FIGS. 24A through 24E are explanatory illustrations of the principle of the microwave modulation of the pulse amplitude modulated waves in four channels.
Figure 24B:
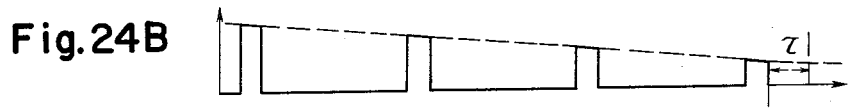
Figure 24C:
Figure 24D:
Figure 24E:

FIG. 22 shows another embodiment by which pulse amplitude modulated waves in four channels are modulated by a microwave. In FIG. 22, pulse voltages shown in FIGS. 23(A), 23(B), 23(C) and 23(D) are applied to the transmission lines 17a, 17b, 17c and 17d, respectively. Assume that the period of the pulses is "T" and that the phase difference between FIGS. 23(A) and 23(B), 23(B) and 23(C), and 23(C) and 23(D) is "$\tau$". Further assume that pulses synchronized with the transmission lines 17a, 17b, 17c and 17d are applied to the transmission lines 23a, 23b, 23c and 23d, respectively, and different signal waves are applied to the transmission lines 22a, 22b, 22c and 22d, respectively. These signal waves are pulse-modulated in the modulation portions 25a, 25b, 25c and 25d, respectively. If the distances between the microwave modulation portion 24 and the respective pulse modulation portions 25a, 25b, 25c and 25d are selected equal to each other, waveforms reaching the transmission line 26 will correspond to those shown in FIGS. 24(A), 24(B), 24(C) and 24(D) which correspond to the waveforms in FIGS. 23(A), 23(B), 23(C) and 23(D), respectively. The overall result is shown in FIG. 24(C). In this FIGURE, the waveforms shown in dotted lines represent the respective signal waves.

Figure 25A:
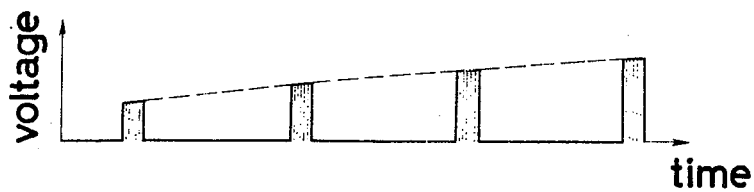
FIGS. 25A through 25E are explanatory illustrations of the waveforms obtained when the four channel pulse modulated waves is further modulated with microwave.
Figure 25B:
Figure 25C:
Figure 25D:
Figure 25E:

If the structure is designed such that when the microwave modulated by the pulses in the pulse modulation portion 14 reaches the modulation portion 24, the pulse modulated waves modulated in the modulation portion 25a, 25b, 25c and 25d reach modulation portion 24, respectively, the waveforms in FIGS. 25(A), 25(B), 25(C) and 25(D) are obtained in response to the respective signals, resulting in the modulation output shown in FIG. 25(C) in the transmission line 11'.

Figure 26:
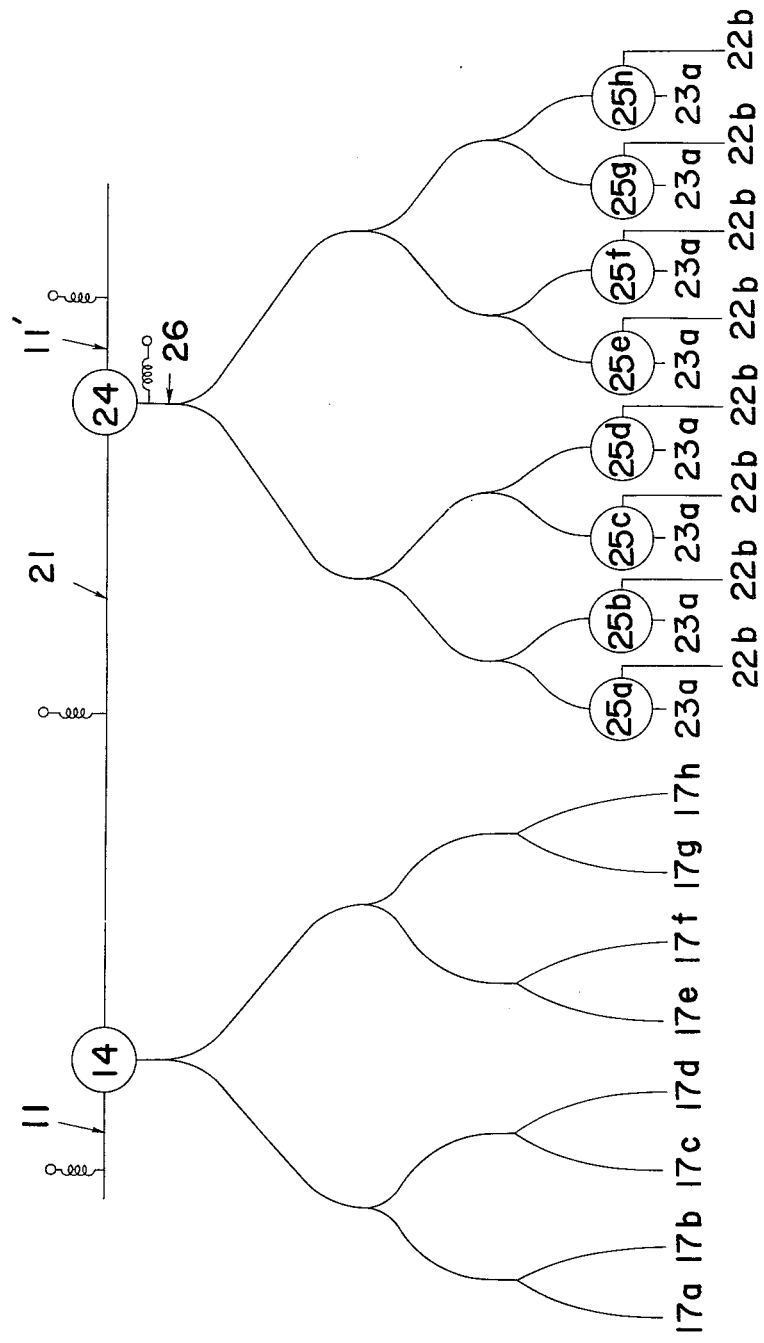
FIG. 26 is an explanatory illustration of another embodiment of the transmission line according to the present invention which modulates eight channel pulse amplitude modulated waves with microwave.

An example in which signals in four channels are pulse modulated and further modulated with microwave has been described. It is generally possible, however, to provide as many channels as required to modulate the kinds of signals to be treated. An example is shown in FIG. 26 in which eight channel pulse amplitude modulated waves are further modulated with microwave. The modulating principle in this case is the same as that in the embodiment of FIG. 22.

Another embodiment in which an element having the structure shown in FIG. 12 is incorporated in the transmission lines so as to operate as a switching element to perform a logic operation.

Figure 27A:
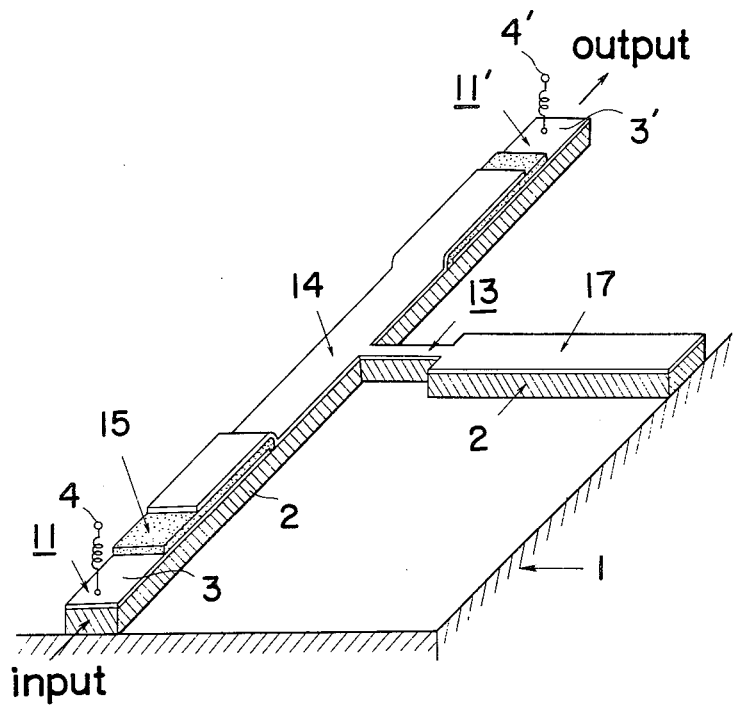
FIG. 27(A) is a perspective view of another embodiment of the transmission line according to the present invention which has a microwave switching element property.

Referring to FIG. 27, when a trigger voltage is applied to the blocking electrode 17 so that the latter is biased in reverse direction, the n-type semiconductor layer 2 is filled with the depletion layer and a transmission line is formed between the blocking electrode 17 and the n$^+$-type semiconductor layer 1. In FIG. 27(A), the blocking electrodes 3, 3' of the transmission lines 11, 11' are capacitively coupled through the dielectrics 15 to the blocking electrode 14 of the switching operation portion. The signal input transmission line 11 is constituted according to the same principle as that of the trigger transmission line 17. When a reverse voltage is applied to the bias terminals 4, 4' to fill the n-type semiconductor layer 2 with the depletion layer, a microwave power entering the input transmission line 11 passes through the switching operation portion 14 and appears at the output transmission line 11'. A trigger transmission line 13 acts as an inductance for the microwave and, therefore, the microwave is prevented from leaking into the trigger source. Then, the reverse voltage applied to the blocking electrode 17 is removed or inversed. As a result, the n-type semiconductor layer 2 below the trigger transmission line 13 becomes resistive and, therefore, the microwave cannot pass through the switching operation portion 14 and the output disappears.

Figure 27B:
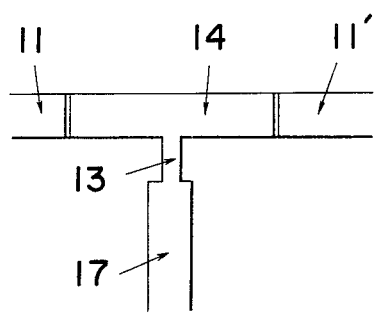
FIG. 27(B) is a plane view showing the element in FIG. 27(A) in more simplified form.

FIG. 27(B) is a schematic plane view of the configuration shown in FIG. 27(A), in which the connections between the switching operation portion 14 and the input and output transmission lines 11, 11' are each represented by a pair of solid lines because the coupling therebetween is capacitive.

A logic circuit element using the switching element in FIG. 27(B) will be described hereinafter.

FIG. 27(A) shows an embodiment of a logical sum circuit element having trigger transmission lines 17 and 17', microwave transmission lines 11 and 11' and bias transmission lines 27 and 27'. Without signal applied to the trigger transmission lines 17 and 17', a microwave cannot pass through the switching operation portions 14 and 14', resulting in no output in the transmission line 11'. When a signal is applied to only the trigger transmission line 17, the microwave can pass through the switching operation portion 14 to the transmission line 11'. When a signal is applied to both the trigger transmission lines 17 and 17', the microwave can pass through the switching operation portions 14 and 14' to the transmission line 11'. This means that this element operates as a logical sum element. That is, assuming that the signals entering into the switching operation portions 14 and 14' are represented by "X" and "Y", respectively, a logical sum circuit operation in accordance with the truth table shown in FIG. 28(B) is obtained.

FIG. 29(A) shows another embodiment of a logical product circuit element. In FIG. 29(A), when no trigger voltages are applied to the trigger input transmission lines 17 and 17', the switching operation portions 14 and 14' block the microwave and, therefore, the latter cannot reach the transmission line 11'. This is also true when a signal is applied to either of the switching operation portions 14 or 14' because the other switching operation portion is in blocking state. However, when trigger voltages are applied simultaneously to both the switching operation portions 14 and 14', the microwave can reach the transmission line 11'. Accordingly, the truth table of this element becomes that shown in FIG. 29(B). That is, by capacitively connecting two transmission lines having respective switching operation portions in series, a logical product circuit element can be obtained.

FIG. 30 is a cross section of an embodiment of a NOT circuit element the plane view of which is the same as that in FIG. 27(B). Further, the signal terminal 17 has the same structure as that of the terminal 17 in FIG. 27(B). However, a trigger terminal (transmission line) 17' is connected to the opposite side of the element. In this case, reverse-bias is applied to signal terminal 17 beforehand.

When a trigger voltage is not applied to the terminal 17' (i.e., zero voltage), the microwave can pass freely through this element because of the reverse-biased signal terminal 17. However, when the trigger voltage equal to the voltage applied to the signal terminal 17 are applied to the terminal 17', the depletion layer produced by the voltage applied to the terminal 17 is extinguished and, therefore, the microwave is blocked and cannot pass through the element. Accordingly, this element exhibits the nature of a NOT element.

FIG. 13(A) shows an example of an exclusive logical sum circuit element. The structure of this element is similar to that of the logical sum element in FIG. 28. Though the element in FIG. 28 uses a pair of the elements shown in FIG. 27, the element in FIG. 31(A) uses a pair of the elements shown in FIG. 30. In FIG. 31(A), the transmission line shown in broken lines corresponds to the terminal 17' in FIG. 30. The trigger transmission lines 17 and 17' shown in dotted lines and solid lines respectively have a common trigger source.

When a signal is applied to neither the transmission line 17 nor the transmission lines 17', there are no depletion layers produced below the switching operation portions 14 and 14' and, therefore, the microwave is blocked and cannot pass through the switching operation portions 14 and 14'.

Referring to the right side element shown as the switching operation portion 14, it is seen from FIG. 30 that when a signal is applied to the transmission line 17, the portion of the n-type semiconductor layer below the switching operation portion 14 is filled with a depletion layer. However, since a trigger voltage is applied to the left side element (the terminals of which are indicated in parentheses), the blocking electrode is biased forwardly and the microwave is blocked and cannot pass through the portion below the switching operation section 14'.

Then, when the signal is applied to only the transmission line 17' shown on solid lines, the microwave can pass through the switching operation portion 14' to the transmission line 11' for the same reason as in the case where the signal is applied to only the transmission line 17, but it cannot pass through the switching operation portion 14. Further, when the signal is simultaneously applied to both the transmission lines 17 and 17' in FIG. 30, the potentials of the transmission lines 17 and 17' become equal and, therefore, it is impossible to fill either the switching operation portion 14 or 14' with the depletion layer. Accordingly, the microwave is blocked and cannot pass through the switching operation portions 14 and 14', resulting in no microwave output in the transmission line 11'. As a result, the truth table of the element becomes that shown in FIG. 31(B).

Figure 32:
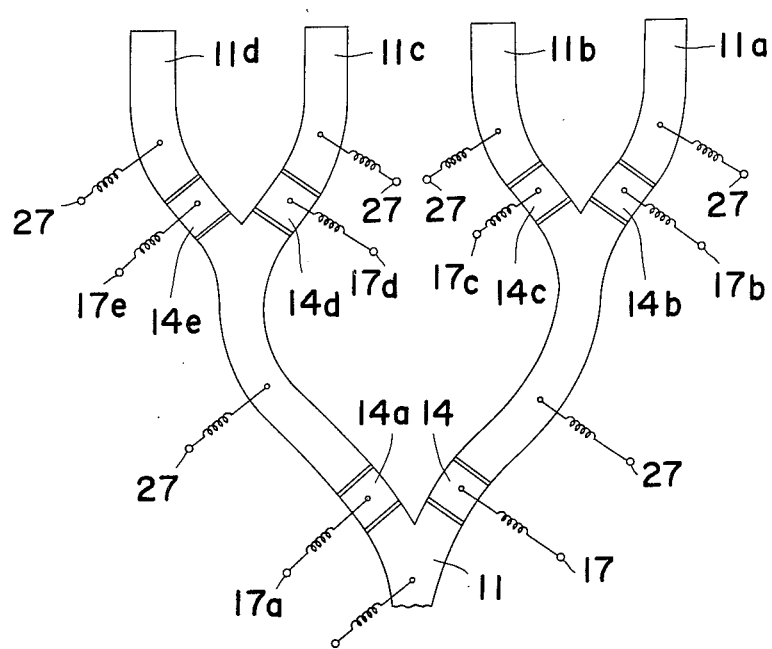
FIG. 32 is an explanatory illustration of another embodiment constituting a tree circuit by using the switching element in FIG. 27.

FIG. 32 shows a portion of an embodiment of a tree circuit (decoder). Practically, branches of the tree may spread in two dimensions. In this circuit element, when trigger voltages are applied to only the terminals 17 and 17$b$, the signal can pass through the switching operation portions 14 and 14$b$ to the transmission line 11$a$ but cannot pass through the other switching operation portions to the transmission lines 11$b$, 11$c$ and 11$d$. On the other hand, when the trigger voltage is applied to only the transmission lines 17 and 17$c$, an output is obtained in only in the transmission line 11$b$ and when the trigger voltages are applied to the terminals 17$a$ and 17$d$, an output is obtained in only the transmission line 11$c$ and when the trigger voltages are applied to only the terminals 17$a$ and 17$e$, an output is obtained in only the transmission line 11$d$.

FIG. 33 shows an example of a high-speed transmission shift line circuit element in which the transmission lines and the switches are represented by lines and small circles, respectively. When the switches $x_0$ and $x_1$ are opened, that is, made 0, a microwave entering into input terminals $A_0$, $A_1$, $A_2$ and $A_3$ appear at output terminals $y_0$, $y_1$, $y_2$ and $y_3$, respectively. When the switch $x_0$ is made 1, i.e., closed and the switch $x_1$ is made 0, the microwave entering into the inputs $A_0$, $A_1$, $A_2$ and $A_3$ appear at the outputs $y_1$, $y_2$, $y_3$ and $y_4$, respectively. By assigning the input terminals $A_0$ to $A_3$ the least ascending orders of significance, by making the input terminals $A_0$ to $A_3$ correspond in order to the output terminals $y_0$ to $y_3$, and by making the output terminals $y_5$ and $y_4$ higher in order by one than the output terminals $y_4$ and $y_3$, the switchover of the switches $x_0$ and $x_1$ to the 1 and 0 state respectively, corresponds to the carrying operations of the signals at the input terminals $A_0$, $A_1$, $A_2$ and $A_3$ by one order. And the switchover of the switches $x_0$ and $x_1$ to the 0 and 1 states respectively corresponds to the carrying operations of the signals at the input terminals $A_0$, $A_1$, $A_2$ and $A_3$ by two orders. When both the switches $x_0$ and $x_1$ are made 1, the signals at the input terminals $A_0$, $A_1$, $A_2$ and $A_3$ are carried by three orders. FIG. 32(B) shows the truth table in the case where the input terminals $A_0$, $A_1$, $A_2$ and $A_3$ are each supplied with operational inputs of 1, and it is possible to carry each by a maximum of three. Further, it is possible to fabricate various carry element using this principle.

In the previously mentioned embodiments, the input is microwave. However, pulses are also usable instead of microwave.

When the width and height of the transmission line of the present invention are selected on the order of 10 and 3 $\mu$m, respectively, and GaAs is used as the semiconductor, the propagation velocity of the depletion layer becomes $10^7$ cm/sec. and, therefore, the switching time is as short as 30 p seconds which is much faster than that of the conventional element which is on the order of nano seconds. Furthermore, since the present element consumes almost no power in switching operation and the size of the unit can be made very compact, it is advantageous when used in an information processing device. In addition to these advantages, since GaAs exhibits a negative mobility in high electric field strength, it is possible to the tree circuit in FIG. 31 to make the same output level as the input level.

As described hereinbefore, the present invention comprises an n or p type resistive semiconductor and at least one blocking electrode provided thereon and supplied with a bias voltage to produce a depletion layer in the resistive semiconductor layer to thereby form a transmission line for microwave etc. and has the following features over the conventional transmission line:

(i) Since the present invention utilizes the depletion layer in the semiconductor as a medium for transmitting electromagnetic wave, it is possible to fabricate a lossless transmission line for signals of up to a higher frequency than with the conventional micro strip transmission line.

(ii) By using semiconductor such as GaAs which exhibits negative differential mobility, it is possible to fabricate a completely lossless transmission line and by further applying a high voltage, it is possible to realize an amplification line.

(iii) By varying the height of barrier produced by the blocking contact, transmission lines suitable for various objects and applications can be easily designed.

(iv) Since the size of the transmission line can be made very compact, it is easy to fabricate it in IC form.

As mentioned above, the present invention can be used for transmitting pulses in piko second order as well as transmitting millimeter wave and by charging the configuration of at least one portion of the transmission line suitably, it is possible to form a circuit element in the transmission line integrally techniques therewith. Such structure can be easily realized by epitaxial fabricating the conductive semiconductor layer and the resistive semiconductor layer and by etching them according to the conventional chemical etching technique. The transmission line with or without circuit elements integral therewith can be applied to millimeter wave communication, the space communication, the electronic control techniques, measuring apparatuses for millimeter wave, ultra high speed electronic computers etc.

What is claimed is:

1. An electromagnetic semiconductor device comprising in combination, a semiconductor body exhibiting a negative conductivity under a high electric field, a conductive layer provided on one surface of said semiconductor body, at least one blocking contact provided on the other surface of said semiconductor body, at least one means for applying a reverse biasing voltage between said conductive layer and said blocking contact to produce a depletion layer in said semiconductor body, at least one input means for introducing electromagnetic waves into said semiconductor body in parallel to said conductive layer, and at least one output means for extracting said electromagnetic waves from said semiconductor body in parallel to said conductive layer.

2. An electromagnetic semiconductor device as set forth in claim 1, wherein said semiconductor body is of n-type semiconductor, the carrier density of which is on the order of $10^{13}$ to $10^{15} cm^{-3}$ in an electric field of low intensity.

3. An electromagnetic semiconductor device as set forth in claim 1, wherein said conductive layer is $n^+$-type semiconductor.

4. An electromagnetic semiconductor device as set forth in claim 1, wherein said conductive layer is metal.

5. An electromagnetic semiconductor device as set forth in claim 1, wherein said conductive layer is an ohmic electrode.

6. An electromagnetic semiconductor device as set forth in claim 1, wherein said blocking electrode is a Schottky electrode.

7. An electromagnetic semiconductor device as set forth in claim 1, wherein said blocking electrode is a p-n junction.

8. An electromagnetic semiconductor device as set forth in claim 1, further comprising an inductance disposed between said conductive layer and said reverse biasing voltage applying means.

9. A method for the transmission of electromagnetic waves, which comprises the steps of:
using an electromagnetic semiconductor device comprising a semiconductor body, a conductive layer provided on one surface of said semiconductor body and at least one blocking contact provided on the other surface of said semiconductor body,
applying a biasing voltage between said conductive layer and said blocking contact to produce a depletion in said semiconductor body, and
introducing electromagnetic waves into said semiconductor body to transmit said electromagnetic waves through said depletion layer as the medium.

10. An electromagnetic semiconductor device comprising in combination, a semiconductor body exhibiting a negative conductivity under a high electric field, the configuration of at least one portion of which is made discontinuous; a conductive layer provided on one surface of said semiconductor body; at least one blocking contact provided on the other surface of said semiconductor body, the configuration of at least one portion of which is made discontinuous; at least one means for applying a reverse biasing voltage between said conductive layer and said blocking contact to produce a depletion layer in said semiconductor body; at least one input means for introducing electromagnetic waves into said semiconductor body in parallel to said conductive layer; and at least one output means for extracting said electromagnetic waves from said semiconductor body in parallel to said conductive layer.

11. An electromagnetic semiconductor device as set forth in claim 10, wherein said at least one portion of said semiconductor body is thicker than the other portions thereof.

12. An electromagnetic semiconductor device as set forth in claim 10, wherein said at least one portion of said semiconductor body is thinner than the other portions thereof.

13. An electromagnetic semiconductor device as set forth in claim 10, wherein said at least one portion of said semiconductor body is wider than the other portions thereof and said at least one portion of said blocking contact is wider than the other portions thereof.

14. An electromagnetic semiconductor device as set forth in claim 10, wherein said at least one portion of said semiconductor body is narrower than the other portions thereof and said at least one portion of said blocking contact is narrower than the other portions thereof.

15. An electromagnetic semiconductor device as set forth in claim 10, wherein said at least one portion of said semiconductor body is thicker and narrower than the other portions thereof and said at least one portion of said blocking contact is narrower than the other portions thereof.

16. An electromagnetic semiconductor device as set forth in claim 10, wherein said at least one portion of said semiconductor body is thinner and wider than the other portions thereof and said at least one portion of said blocking contact is wider than the other portions thereof.

* * * * *